United States Patent [19]

Look

[11] Patent Number: 4,478,778
[45] Date of Patent: Oct. 23, 1984

[54] METHOD OF MANUFACTURING FLAT PEELABLE CABLE

[75] Inventor: Raymond J. Look, Largo, Fla.

[73] Assignee: AMP Incorporated, Harrisburg, Pa.

[21] Appl. No.: 508,700

[22] Filed: Jun. 28, 1983

Related U.S. Application Data

[63] Continuation of Ser. No. 332,271, Dec. 18, 1981, abandoned.

[51] Int. Cl.³ ............................................. B29F 3/10
[52] U.S. Cl. ............................... 264/146; 156/244.12; 156/244.27; 156/378; 156/498; 156/500; 174/32; 264/174; 425/114; 425/505; 425/508
[58] Field of Search ................... 264/174, 172, 146; 425/113, 114, 508, 505; 174/32; 156/378, 244.12, 500, 244.27, 498

[56] References Cited

U.S. PATENT DOCUMENTS

| 2,628,998 | 2/1953 | Frisbie | 425/114 |
|---|---|---|---|
| 2,826,782 | 3/1958 | Dugall et al. | 425/114 |
| 3,252,183 | 5/1966 | Bronzert | 425/114 |
| 3,608,035 | 9/1971 | Frohlich | 264/174 |
| 3,758,247 | 9/1973 | Deegen | 264/172 |
| 3,775,552 | 11/1973 | Schumacher | 174/105 R |
| 4,097,324 | 6/1978 | Emmel | 425/508 |
| 4,134,953 | 1/1979 | Dembiak et al. | 264/174 |
| 4,149,026 | 4/1979 | Fritz et al. | 174/32 |
| 4,150,929 | 4/1979 | Brandt | 425/114 |
| 4,154,977 | 5/1979 | Verma | 174/117 F |
| 4,165,957 | 8/1979 | Kertscher | 264/174 |
| 4,221,756 | 9/1980 | Piper et al. | 264/174 |
| 4,295,812 | 10/1981 | Hoddinott | 264/174 |
| 4,341,509 | 7/1982 | Harlow | 264/174 |
| 4,351,689 | 9/1982 | Elliott et al. | 156/378 |

Primary Examiner—Jeffery Thurlow
Attorney, Agent, or Firm—E. Bruce Faller; Russell J. Egan

[57] ABSTRACT

Process for manufacturing flat multi-conductor cable having two cable members and peelable internal lamina utilizes a pair of dies which simultaneously align conductors, laminate internal lamina, and extrude external lamina thereon. Each die has a conductor aligning surface with parallel linear conductor-receiving recesses therein an adjacent extrusion surface. Conductors and internal lamina are drawn between aligning surfaces of mated dies and then between extrusion surfaces where vinyl is extruded through an aperture in each die to form external lamina. A knife-edged die insert adjacent one side of the aligning and extrusion surfaces provides a V-notch in one edge of the cable to facilitate peeling apart cable members for termination to a two-sided connector.

4 Claims, 7 Drawing Figures

U.S. Patent    Oct. 23, 1984    Sheet 1 of 3    4,478,778
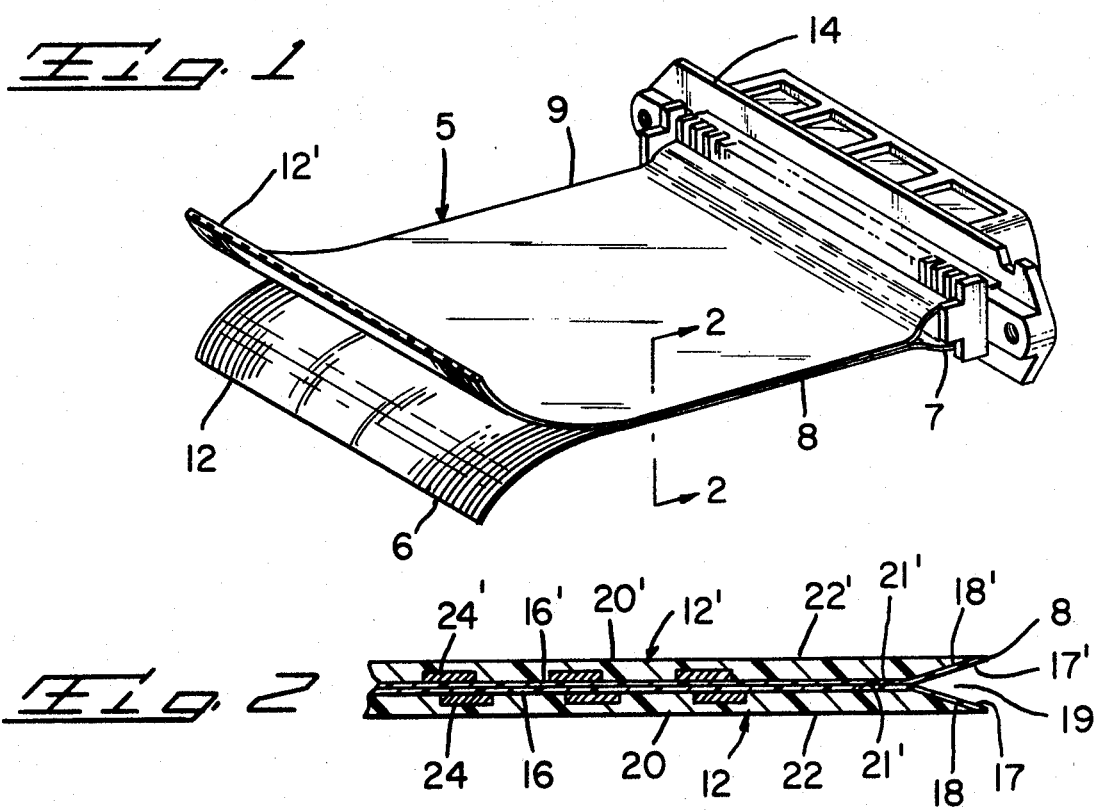
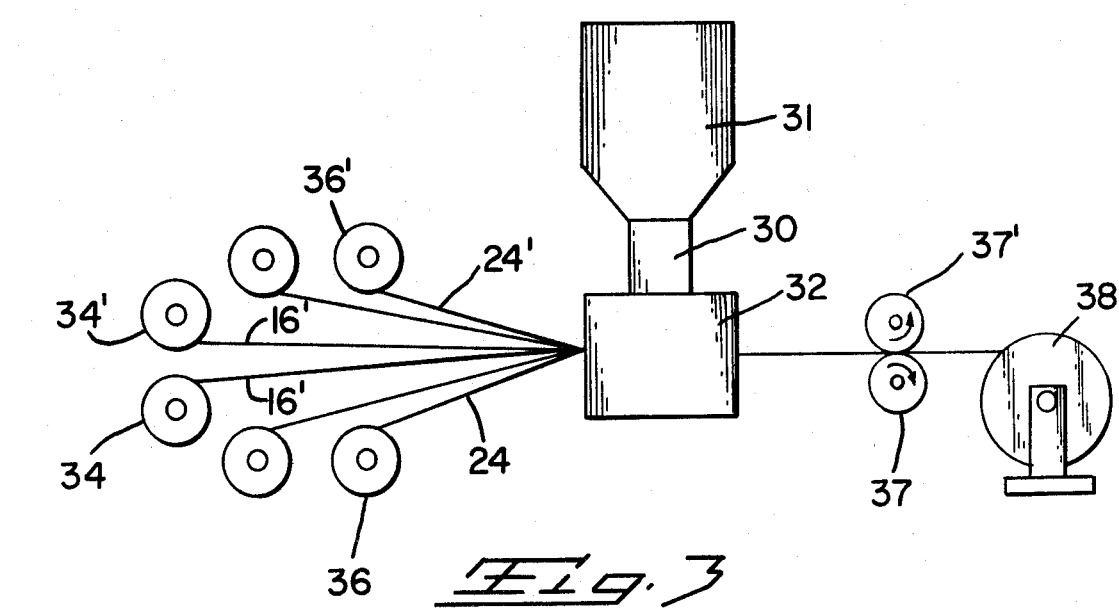

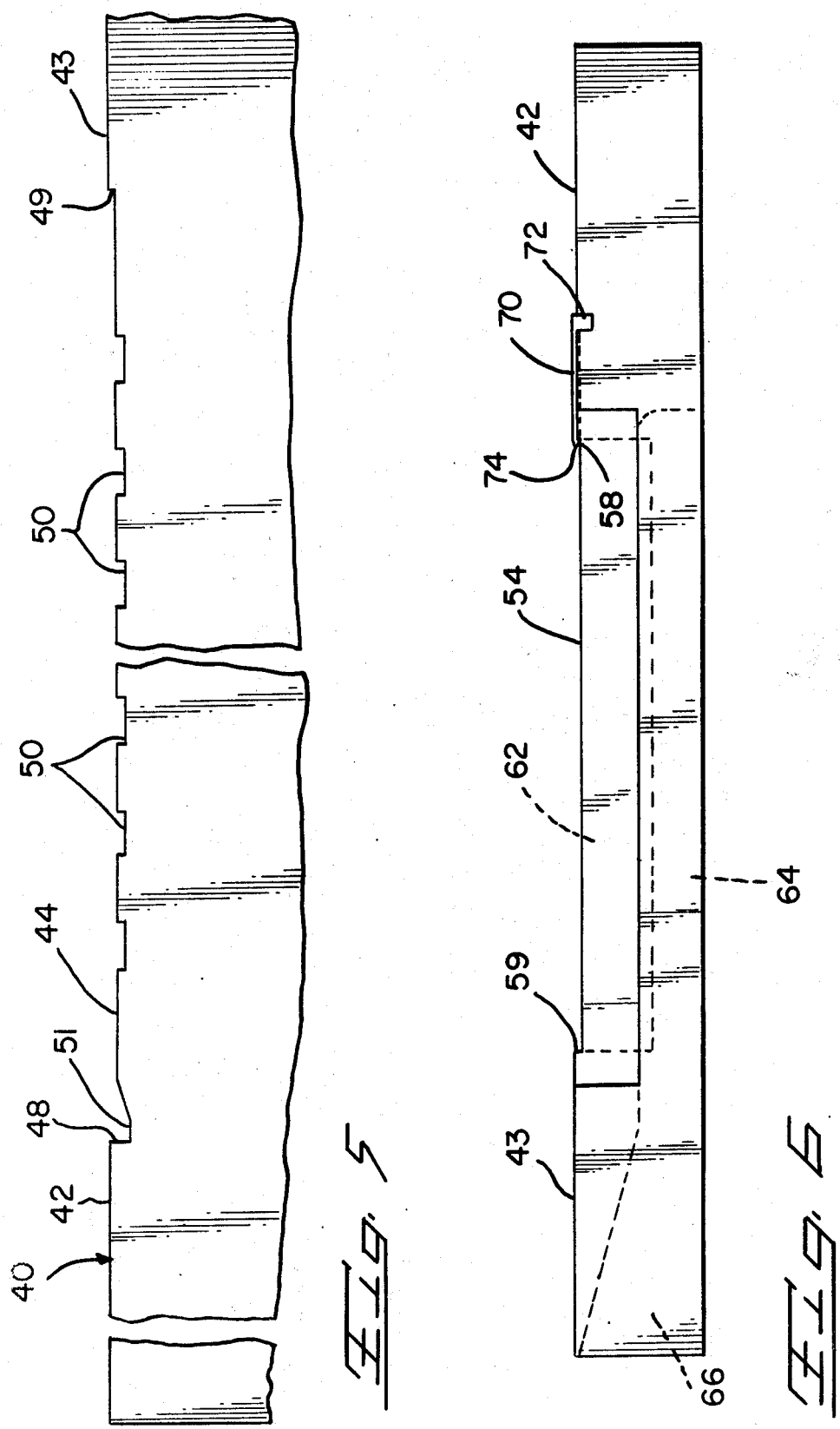

METHOD OF MANUFACTURING FLAT PEELABLE CABLE

This is a continuation of application Ser. No. 332,271, filed Dec. 18, 1981.

BACKGROUND OF THE INVENTION

The present invention relates to a process for manufacturing flat multi-conductor cable, particularly a cable comprising two peelable flat cable members.

There is described in U.S. Pat. No. 4,149,026 a flat multi-conductor cable of the type comprising two flat cable members laminated together with two internal lamina of flexible material therebetween to form cable members which are secured together by an adhesive (FIG. 5). In order to accomplish this, the patent contemplates bonding the interior surfaces together by lines or dots of adhesve, or alternatively by selectively applying heat to the cable. These methods require the application of an adhesive, and somewhat complicate the manufacture. Further, where flat cable members are manufactured separately and subsequently bonded together, closely controlled spacing between conductors in adjacent cables is difficult to maintain.

SUMMARY OF THE INVENTION

The manufacturing process of the present invention provides a means for manufacturing multi-conductor cable comprising two flat multi-conductor cable members formed together. Each cable member has an internal lamina peelably bonded to the internal lamina of the adjacent cable to form a dielectric layer between two planes of conductors. A V-notch is provided in the edge of the cable to facilitate peeling the cable members apart for termination to a connector having two opposed rows of terminals. The dies used have an aligning section for the internal lamina and conductors and an extrusion section for applying external layers, thereby providing means for simultaneously laminating and extruding components to form the completed cable. The process and apparatus for practicing same assure a controlled spacing of individual conductors in each cable member, and a controlled spacing between conductors of adjacent cable members.

These and other features will be apparent with reference to the drawings and description which follow.

BRIEF DESCRIPTION OF THE DRAWINGS

FIG. 1 is a perspective of the cable as terminated to a two-row connector.
FIG. 2 is a cross section of the cable.
FIG. 3 is a schematic of the manufacturing apparatus.
FIG. 5 is an end view of the lower extrusion die.
FIG. 6 is an end view of the lower extrusion die.

DETAILED DESCRIPTION OF THE PREFERRED EMBODIMENT

Figure 4:
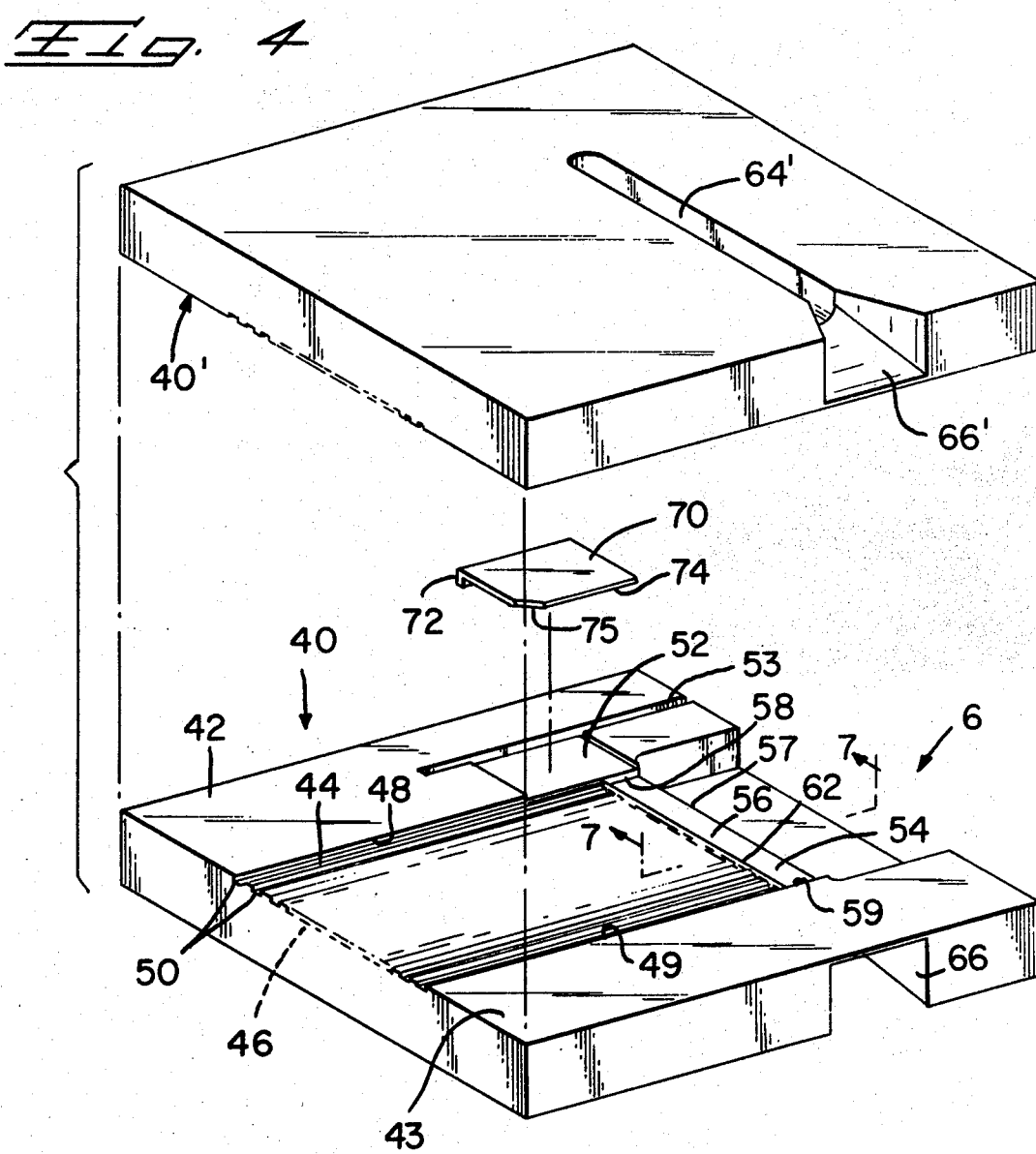
FIG. 4 is a perspective of the extrusion dies.

FIG. 1 depicts a flat twenty-five-pair communication cable 5 as terminated to a two-row insulation displacing connector 14 of the type described in U.S. Pat. No. 3,760,335. A section of cable 5 is shown peeled apart to separate first cable member 12 from second cable member 12' at first end 6 and second end 7, which is attached to the connector 14. Each cable member 12, 12' has the insulation removed from a strip proximate the second end 7 thereof to expose the conductors 24, 24' as described in U.S. Pat. No. 4,160,573. This leaves a strip of insulation on the very end of the cable members 12, 12' to maintain the alignment of the conductors 24, 24' for proper registration with the electrical contacts in the connector 14. The cable 5 is laterally bounded by a first edge 8 and a second edge 9, and is of the general type described in U.S. Pat. No. 4,149,026, which is hereby incorporated by reference.

FIG. 2 depicts a cross section of the cable 5. The two cable members 12, 12' are separated by a pair of flexible dielectric internal laminas 16, 16' sandwiched therebetween. Each internal lamina 16, 16' has a respective first surface 17, 17' and a respective second surface 18, 18'. The first surfaces 17, 17' are bonded together, as will be described, and the opposed second surfaces 18, 18' are bonded to respective cable members 12, 12' as will be described. The cable members 12, 12' consist of respective external layers 20, 20' each having respective first surfaces 21, 21' and respective outer or second surfaces 22, 22'. The first surfaces 21, 21' have conductors 24, 24' embedded therein; the conductors 24, 24' are flat with a rectangular profile and are embedded in the respective external layers 20, 20' so that one surface of each conductor 24, 24' is flush with the respective first surface 21, 21' of the cable member. The conductors 24 are aligned in parallel in the cable member 12, and are preferably situated with the centers slightly offset from the conductors 24' in cable 12' as taught by U.S. Pat. No. 4,149,026. This minimizes crosstalk in telephone cable applications.

The cable 5 of the present invention exhibits the desirable property of peelability of the internal laminas 16, 16'. This property is made possible by having the internal laminas 16, 16' bonded to the respective cable members 12, 12' with greater adhesion than the internal laminas 16, 16' are bonded to each other. While this could be done by using different adhesives, it is most desirable from a standpoint of cost and convenience to use the same adhesive on both surfaces. It has been found that certain adhesives, when applied to certain surfaces, will adhere to a dissimilar surface more readily than they will adhere to themselves, in the fashion of many adhesive tapes. This property, combined with the property of not re-adhering or exhibiting stickiness when separated, is most desirable for a two-layer transmission cable, so that the component cable members can be separated without disturbing the insulation on the conductors. A suitable product is Melinex type 505, a trademark of ICI Americas, Inc. of Wilmington, Del. Melinex type 505 is a biaxially oriented polyethylene terephthalate (polyester) film, pretreated to promote adhesion. The polyester film is clear and smooth in appeaarance and is capable of withstanding temperatures of 375° F., at which temperature surface adhesion is effected.

The cable described above is manufactured by a combination lamination and extrusion process as depicted schematically in FIG. 3. The internal laminas 16, 16' are drawn from rolls 34, 34' respectively through die housing 32 where the external lamina 20, 20' are extruded thereon. The conductors 24, 24' are drawn from rolls 36, 36' through the die housing 32 with internal laminas 16, 16' by tractor rollers 37, 37'. Only two supply rolls 36, 36' are shown, but one roll is necessary for each conductor in the finished cable 5. Thus, for twenty-five pair cable, a staggered field of fifty feed rolls is necessary to provide the copper conductors. The 25 pairs of conductors 24, 24' are aligned in extruding dies as will be described and vinyl pellets for extrusion to form the external layers 20, 20' are fed into extruder 30 from bin 31. Finished cable 5 is collected on reel 38.

FIG. 4 is a perspective of upper and lower extruding dies 40, 40'. The upper die 40' is essentially the mirror image of lower die 40, so it may be assumed that features of the upper die 40°, denoted by prime numbers corresponding to unprimed numbers in the lower die 40, are similar unless otherwise noted. The lower die 40 has a flat conductor aligning surface 44 which is recessed from flat coplanar mating surfaces 42, 43 which fit snugly against similar surfaces in upper die 40'. The aligning surface 44 is flanked by parallel, opposed first and second sidewalls 48, 49 which serve to recess the surface 44 from mating surfaces 42, 43. The aligning surface 44 is profiled with a plurality of parallel linear recesses 50, each being rectangular in cross section and profiled to closely receive a flat conductor 24 so it is flush with the aligning surface 44. Each linear recess 50 extends from an open first end 46 to an open second end 47 of the aligning surface 44. A flat extruding surface 54 adjacent to surface 44 is recessed slightly further from the mating surfaces 42, 43 than the aligning surface 44 and is flanked by first and second sidewalls 58, 59 which are contiguous and coplanar with sidewalls 48, 49 respectively. A linear aperture 62 extends between the sidewalls 58, 59 between the second end 47 of aligning surface 44 and the first end 56 of extruding surface 54, which has an open second end 57 opposite first end 56. The linear aperture 62 is connected to a reservoir 64, visible as reservoir 65' in upper die 40', which communicates with inlet 66 in the edge of the die 40. The reservoirs 64, 64' fit against flat surfaces inside the die housing 32 (FIG. 3) to form closed channels which communicate with inlets 56, 56'. The extruder 30 (FIG. 3) provides extrusive hot melt to the inlets 66, 66' for extrusion of the outer layers 20, 20' via apertures 62, 62'.

Referring still to FIG. 4, the mating surface 42 has an insert recess 52 which is profiled to receive die insert 70 so that leg 72 of insert 70 fits in slot 53 adjacent recess 52 and knife edge 74 protrudes slightly beyond sidewalls 48, 58, as will be more readily apparent with reference to FIG. 6. Note that there is no slot in die 40' which corresponds to slot 53'.

FIG. 5 is an end view of die 40 facing the first end 46 of aligning surface 44. The linear recesses 50 number twenty-five total in each die 40, 40' for a twenty-five pair communication cable. The surface 44 is flanked by sidewalls 48, 49 which have a depth roughly equivalent to the thickness of an internal lamina 16. Note that surface 44 has an edge recess 51 adjacent first sidewall 48. The recesses 51, 51' permit some separation between internal laminas 16, 16' as they are drawn between aligning surfaces 44, 44' and past knife edge 74.

Figure 7:
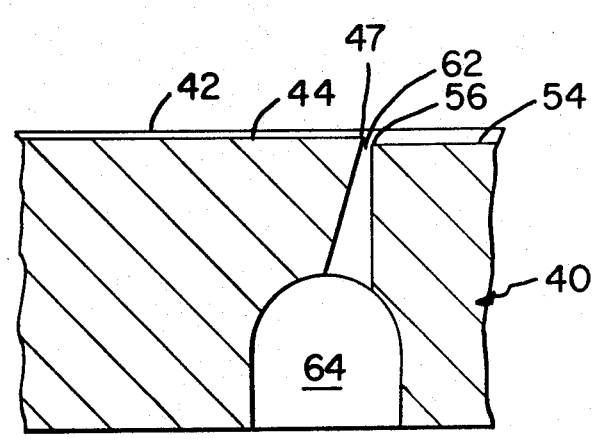
FIG. 7 is a section view of the aperture between the reservoir and extrusion section.

FIG. 6 is an end view of die 40 facing the second end 57 of extruding surface 54. Here the die insert 70 is shown in place in recess 52 in mating surface 42. Note that knife edge 74 protrudes slightly beyond sidewall 58 to effect edge separation of laminas 17, 17' in the finished cable. The extruding inlet 66, reservoir 64, and linear aperture 62 are also visible in phantom in this view; these features are shown in more detail in the cross section of FIG. 7. FIG. 7 clearly shows the depth differential between aligning surface 44 and extruding surface 54; this differential is the same as the thickness of the extruded vinyl in external layer 20 between the first surface 21 and the second surface 22. The total depth of extruding surface 54 below mating surface 42 is the same as the total thickness of a cable member 12.

The manufacturing process described briefly in conjunction with FIG. 3 will now be described in more detail in conjunction with various drawings. First the internal laminas 16, 16' are fed between the assembled dies 40, 40', then the conductors 24, 24' are aligned in the linear recesses 50, 50' and fed between the dies 40, 40'. The dies 40, 40' are heated to about 375° F., and the conductors 24, 24' and internal laminas 16, 16' are then drawn through the dies by tractor rolls 37, 37'. The extruder 30 (FIG. 3) is then activated and the vinyl pellets are extruded through apertures 62, 62' to form the external layer 20, 20'. The complete cable 5 is drawn through the tractor rolls 37, 37' continuously with conductor/internal lamina starter section, which is subsequently trimmed. The heat is sufficient to initiate some bonding of the internal laminas 16, 16' between the aligning surfaces 44, 44', as well as some adherence of linear conductors 24, 24' to second surfaces 18, 18', but the 100 psi pressure exerted by the vinyl melt being extruded through apertures 62, 62' assures good adhesion of all surfaces in contact with internal laminas 16, 16'.

The above described process, apparatus, and materials are the preferred means of manufacturing a peelable twenty-five pair cable of the type described in U.S. Pat. No. 4,149,026. The foregoing description is not intended to limit the scope of the claims which follow.

I claim:

1. A process for manufacturing a multi-conductor cable of the type having two adjacent cable members each having a plurality of flat parallel linear conductors therein, said cable members being separated by at least one dielectric internal lamina, comprises the following steps:

providing a pair of extruding dies each having a flat recessed conductor aligning surface having an open first end and an open second end opposed to said first end, said surface being flanked by opposed parallel first and second sidewalls extending between said ends, said surface being profiled with a plurality of flat linear recesses extending from said first end to said second end parallel to said sidewalls, each said linear recess being profiled to closely receive a linear conductor therein so it is flush with the respective flat recessed surface, said dies being mateable such that said flat recessed surfaces closely receive said at least one lamina of insulation therebetween, each said die further having a flat recessed extruding surface having an open first end adjacent to said second end of said conductor aligning surface and an open second end opposed to said first end, said extruding surface being flanked by opposed parallel first and second sidewalls aligned with respective first and second sidewalls of said conductor aligning surfaces, said first end of each said extruding surface being separated from said second end of the respective conductor aligning surface by a linear aperture which extends between said first and second sidewalls, said extruding surfaces being parallel to said conductor aligning surfaces and recessed slightly further in said die from the respective conductor aligning surface, aligning said flat linear conductors in said linear recesses with said at least one lamina of insulation therebetween with said dies mated together, drawing said linear conductors and said lamina through said dies between said conductor aligning surfaces and said extruding surfaces from said first end of each said die toward said second end, extruding an insulative plastic melt through said apertures, whereby, said plastic melt forms a dielectric external lamina on either side of said dielectric internal lamina, each said external lamina having a plurality of flat parallel linear conductors therein to form a cable member, said linear recesses assuring a closely controlled spacing of the linear conductors.

2. A method of making flat multiconductor cable of the type having two planar arrays of parallel conductors therein, said arrays being separated by a dielectric layer therebetween, said arrays lying on opposite sides of said layer, said arrays lying between said layer and respective external layers, said method comprising the steps of:

drawing two internal laminas and said conductors on convergent paths from substantially endless sources through extrusion means having opposed conductor aligning surfaces which align the conductors relative to each other and against the internal laminas, said laminas forming said internal dielectric layer, extruding an insulative plastic melt against said conductors and said opposite surfaces of said internal laminas to form said external layers.

3. The method set forth in claim 2 wherein the surfaces of said internal laminas are pretreated to promote adhesion when exposed to heat, whereby during extrusion said internal laminas are adhered to each other as well as to said conductors and external laminas.

4. The method of claim 3 wherein said internal laminas are drawn past a knife edge protruding between adjacent edges thereof where said plastic melt is extruded thereagainst, whereby a gap is formed between the internal laminas at one edge of the cable, said gap facilitating separation thereof.

* * * * *